(12) United States Patent
Torigoe et al.

(10) Patent No.: US 9,304,402 B2
(45) Date of Patent: Apr. 5, 2016

(54) LIGHT EXPOSURE APPARATUS AND METHOD OF CONTROLLING THE SAME

(75) Inventors: Tsunemitsu Torigoe, Cheonan-si (KR); Hong Suk Yoo, Anyang-si (KR); Chang Hoon Kim, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1049 days.

(21) Appl. No.: 13/428,961

(22) Filed: Mar. 23, 2012

(65) Prior Publication Data

US 2013/0021590 A1 Jan. 24, 2013

(30) Foreign Application Priority Data

Jul. 21, 2011 (KR) ........................ 10-2011-0072540

(51) Int. Cl.
*G03F 7/20* (2006.01)

(52) U.S. Cl.
CPC .......... *G03F 7/70141* (2013.01); *G03F 7/7035* (2013.01); *G03F 7/70791* (2013.01)

(58) Field of Classification Search
CPC .............. G03F 7/70141; G03F 7/7035; G03F 7/70791; G03F 7/70008; G03F 7/70025; G03F 7/70041; H01S 3/109; H01S 3/1643; H01S 3/025; H01S 3/042; H01S 3/0602; H01S 3/115
See application file for complete search history.

(56) References Cited

U.S. PATENT DOCUMENTS

| | | | | | |
|---|---|---|---|---|---|
| 5,760,408 | A | * | 6/1998 | Kikuchi et al. | 250/492.2 |
| 6,081,320 | A | * | 6/2000 | Tanitsu | 355/71 |
| 2001/0015795 | A1 | * | 8/2001 | Nishi | 355/53 |
| 2005/0052634 | A1 | * | 3/2005 | Sugihara et al. | 355/55 |

\* cited by examiner

*Primary Examiner* — Steven H Whitesell Gordon
(74) *Attorney, Agent, or Firm* — H.C. Park & Associates, PLC

(57) ABSTRACT

The present invention relates to a method of controlling a light exposure apparatus including an exposure beam generator equipped with a prism or a bend mirror and a vacuum chamber through which light generated in the exposure beam generator passes. The method includes, generating an exposure beam; measuring a deviation of a center of the exposure beam from a reference line in the vacuum chamber; and adjusting the prism or the bend mirror in the exposure beam generator to adjust the center of the exposure beam when the center of the exposure beam is misaligned with the reference line.

18 Claims, 22 Drawing Sheets

LIGHT EXPOSURE APPARATUS AND METHOD OF CONTROLLING THE SAME

CROSS-REFERENCE TO RELATED APPLICATION

This application claims priority from and the benefit of Korean Patent Application No. 10-2011-0072540 filed in the Korean Intellectual Property Office on Jul. 21, 2011, which is incorporated herein by reference for all purposes as if fully set forth herein.

BACKGROUND OF THE INVENTION

1. Field of the Invention

The present invention relates to a light exposure apparatus and a method for controlling the same.

2. Discussion of the Background

One of the general trends in the area of manufacturing display devices is to increase the size of a mother substrate so as to reduce the production cost. As the size of a mask corresponding to the mother substrate is increased, the manufacturing cost of the mask is exponentially increased which in turn raises the entire process cost.

Thus, to reduce the manufacturing cost accompanied with an increase of the size of the mask, processes not involving a mask, for example, by applying an inkjet printing or a reverse offset printing method, have been considered.

However, such methods are applicable to only some of the entire manufacturing processes of the panel, and basically, photolithography processes using masks are necessary to finish wirings.

Accordingly, exposure methods using a scanning scheme which involves relative movements between a mask and a substrate using a smaller mask for lowering the manufacturing cost have been applied.

A photolithography technique is commonly performed to form pixels and wiring patterns on a display device (a liquid crystal display or a plasma display device). The exposure process during photolithography uses a mask and illuminates an exposure beam through openings provided in the mask.

The exposure beam used in the exposure process may use a light source of various wavelengths such as a laser. A light exposure apparatus, once it is turned on, may continuously emit the exposure beam for a long period of time. However, the intensity of the exposure beam provided by the light exposure apparatus may deteriorate due to the usage of the light exposure apparatus for an extended period of time. Particularly, if used longer than about 120 hours, the light intensity from the light exposure apparatus may be reduced by about 15% such that the intensity of the exposure beam is rapidly reduced and the photolithography process deteriorates.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a method of controlling a light exposure apparatus which does not deteriorate intensity even after a long time usage.

Additional features of the invention will be set forth in the description which follows, and in part will be apparent from the description, or may be learned by practice of the invention.

One exemplary embodiment provides a method of controlling a light exposure apparatus including an exposure beam generator having a prism or a bend mirror and a vacuum chamber through which light generated in the exposure beam generator passes, including: generating an exposure beam; measuring a deviation of a center of the exposure beam from a reference line in the vacuum chamber; and adjusting the prism or the bend mirror in the exposure beam generator to adjust the center of the exposure beam when the center of the exposure beam is misaligned with the reference line.

Another exemplary embodiment provides a light exposure apparatus, including: an exposure beam generator, including a prism or a bend mirror and a vacuum chamber, the vacuum chamber being configured to pass an exposure beam generated by the exposure beam generator; a measurement unit to measure a deviation of a center of the exposure beam from a reference line; and an adjustment unit to adjust the prism or the bend mirror in the exposure beam generator to adjust the center of the exposure beam when the center of the exposure beam is misaligned with the reference line.

According to the light exposure apparatus and the method of controlling the apparatus, the center of the exposure beam is not misaligned with the light axis of the light exposure apparatus after a long time of usage such that the exposure amount is not reduced.

Also, even if the center of the exposure beam is misaligned, the center of the exposure beam is corrected through adjustment in the exposure beam generator in the light exposure apparatus such that the setting state of the light exposure apparatus may be maintained as it is, thereby reducing time loss for re-setting.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
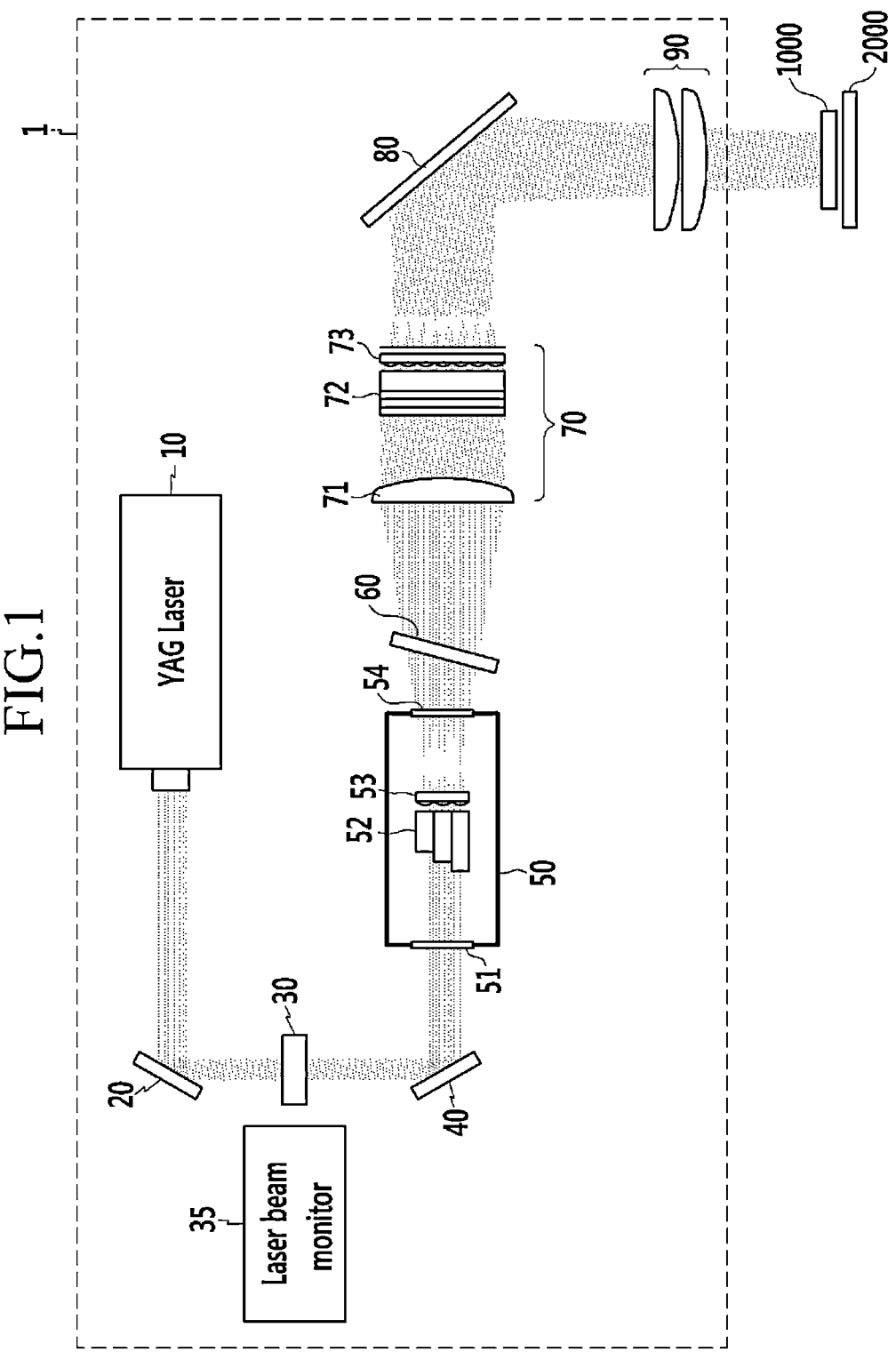
FIG. 1 is a diagram to illustrate a light exposure apparatus and an exposure path according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, when an element is referred to as being "directly on" another element, there are no intervening elements present.

Hereinafter, a light exposure apparatus and an exposure path according to an exemplary embodiment of the present invention will be described with reference to FIG. 1.

FIG. 1 is a diagram to illustrate a light exposure apparatus and exposure path according to an exemplary embodiment of the present invention.

A light exposure apparatus 1 according to an exemplary embodiment of the present invention may include an exposure beam generator 10 (a YAG laser is used in the present exemplary embodiment), first, second, and third mirrors 20, 40, and 80, a vacuum chamber 50 including a first light path difference plate 52 and a first fly eye lens 53, a plane parallel rotation plate 60, first and second light collecting lenses 71 and 90, a second light path difference plate 72, and a second fly eye lens 73. Also, an exposure beam monitor unit 30 may also be included to monitor the path of the exposure beam.

Figure 22:
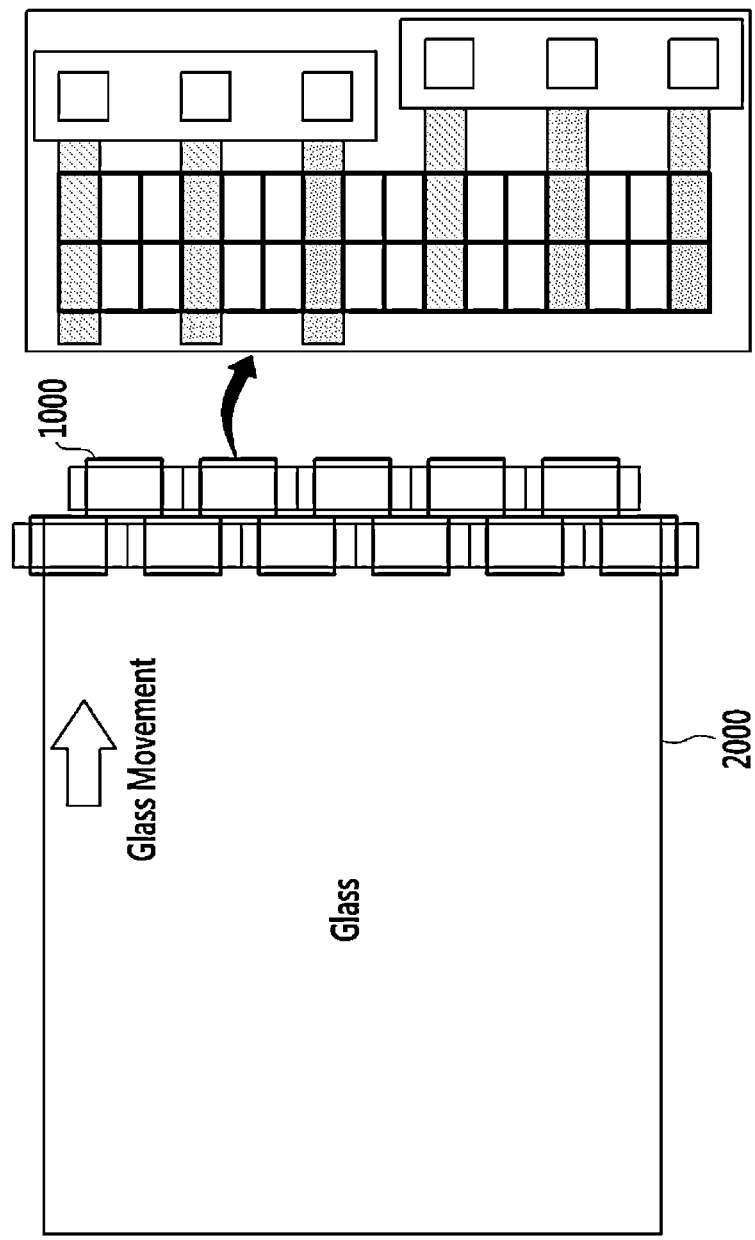
FIG. 22 is a diagram to illustrate an exposure method according to a scanning scheme according to an exemplary embodiment of the present invention.

The exposure beam emitted from the light exposure apparatus 1 is provided to a substrate 2000 through a mask 1000, and the mask 1000 and the substrate 2000 maintain a certain interval (about 200-350 nm). Also, as shown in FIG. 22, the mask 1000 may include a plurality of small masks partially covering a substrate (glass) for performing the exposure process.

Hereinafter, a path of the exposure beam emitted from the light exposure apparatus 1 according to the present exemplary embodiment will be described.

While the exposure beam generator 10 is a light source to provide the exposure beam and the YAG laser is used in the exemplary embodiment, exposure beams having various wavelengths may be used according to an exemplary embodiment.

A light path of the exposure beam emitted from the exposure beam generator 10 may be respectively changed by 90 degrees while being reflected by the first mirror 20 and the second mirror 40, and the light then enters the vacuum chamber 50. The vacuum chamber 50 may include a first chamber window 51 to receive the exposure beam and a second chamber window 54 to emit the exposure beam, and the first light path difference plate 52 and the first fly eye lens 53 positioned therein. The first light path difference plate 52 may provide a light path difference to the exposure beam. The first fly eye lens 53 has a structure in which a plurality of convex lenses are formed like the eyes of a fly, and the light passing through the first light path difference plate 52 is collected to a focal point and scattered according to each convex lens. The focal points of the first fly eye lens 53 may be positioned in the vacuum chamber 50.

The exposure beam emitted through the second chamber window 54 of the vacuum chamber 50 may be reflected by the third mirror 80 after passing through the plane parallel rotation plate 60 and an optical unit 70, and may be provided to the mask 1000 after being collected by the second light collecting lens 90. Here, the optical unit 70 may include the first light collecting lens 71, the second light path difference plate 72, and the second fly eye lens 73.

The plane parallel rotation plate 60 may be a plane parallel plate that is obliquely formed with respect to the light path. The first light collecting lens 71 may serve to collect the light that has been scattered by the first fly eye lens 53, and the second light path difference plate 72 and the second fly eye lens 73 may provide the light path difference like the first light path difference plate 52 and the first fly eye lens 53 and serve to collect the light to the focal points of the second fly eye lens 73 and scattering the light. Next, the light path may be changed by 90 degrees by the third mirror 80, and the light that has been scattered in the second fly eye lens 73 may pass through the second light collecting lens 90 and may be transmitted to the mask. While the second light collecting lens 90 includes two convex lenses in the exemplary embodiment, it may include a convex lens or an additional light collecting lens may be used. Also, while the first light path difference plate 52 and the second light path difference plate 72 have different structures in the exemplary embodiment, they may have the same structure in certain embodiments, and the light path difference provided by the first and second light path difference plates 52 and 72 may have the same value or different values.

Further, the exposure beam monitor unit 30 may be disposed between the first mirror 20 and the second mirror 40 to monitor whether the path of the exposure beam is deviated. The exposure beam monitor unit 30 according to an exemplary embodiment may include a device to film the exposure beam either in the device or outside the device so as to film the path of the exposure beam, and the filmed information may be transmitted to a light exposure apparatus controller (not shown). In certain embodiments, the exposure beam monitor unit 30 may change the path of a portion of the exposure beam solely for an observation purpose.

According to an exemplary embodiment, it is possible to form a path of the exposure beam provided to the mask 1000 from the exposure beam generator 10 differently from as shown in FIG. 1.

Hereinafter, the exposure beam generator 10 according to an exemplary embodiment will be described in detail with reference to FIG. 2 to FIG. 9.

Figure 2:
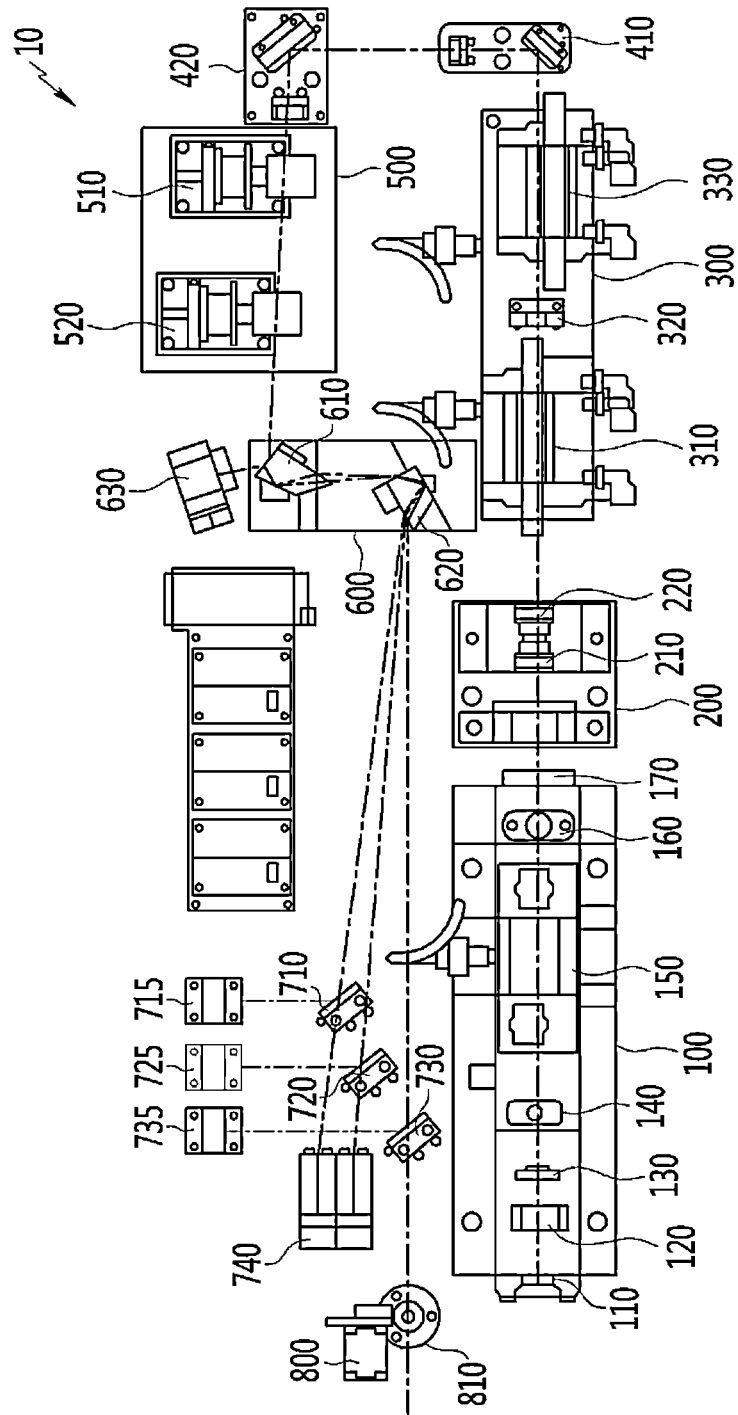
FIG. 2 is a diagram to illustrate an exposure beam generator according to an exemplary embodiment of the present invention.

FIG. 2 is a diagram to illustrate an exposure beam generator according to an exemplary embodiment of the present invention, and FIG. 3 to FIG. 9 are diagrams to explain each portion of an exposure beam generator according to an exemplary embodiment of the present invention or operation characteristics thereof.

Firstly, the overall structure of the exposure beam generator 10 will be described with reference to FIG. 2.

The exposure beam generator 10 may include an oscillator 100, an exposure beam scattering unit 200, an amplifier 300, a high-frequency generator 500, a wavelength division unit 600, first and second bend mirrors 410 and 420, first to third sampling mirrors 710, 720, and 730, first to third power monitors 715, 725, and 735, and an output shutter unit 800.

Figure 3:
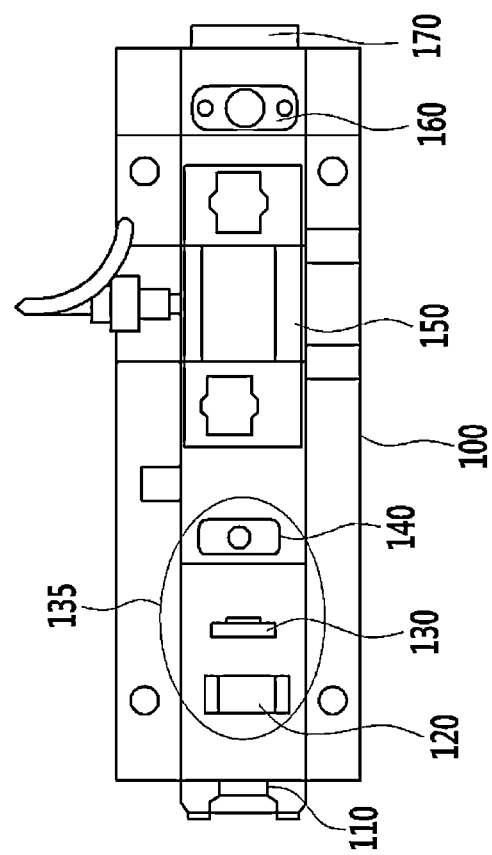
FIG. 3 to FIG. 9 are diagrams to explain each portion of an exposure beam generator according to an exemplary embodiment of the present invention or operation characteristics thereof.

Referring to FIG. 3, the oscillator 100 that initially generates the exposure beam may include a rear mirror 110, a pocket cell 120, a wave plate 130, first and second polarizers 140 and 160, an oscillator pumping chamber 150, and a front mirror 170. The pocket cell 120, the wave plate 130, and the first polarizer 140 together may form a Q switch 135.

The rear mirror 110 may totally reflect the light, and the exposure beam (laser) is emitted when the pocket cell 120 is at an on state, thereby executing a switch function, and changes cyclic polarization to linear polarization. The wave plate 130 has a λ/4 phase difference, and the first and second polarizers 140 and 160 may transmit only the light that is linear polarized in a predetermined direction. The oscillator pumping chamber 150 may house a flash lamp such as a YAG rod material. In a flash lamp, a laser medium is excited such that a population inversion state in which energy is accumulated is formed, and a portion of the laser medium of the population inversion state is smooth such that the light is emitted by natural emission. The front mirror 170 partially transmits or partially reflects the oscillated exposure beam to create a resonance.

Figure 4:
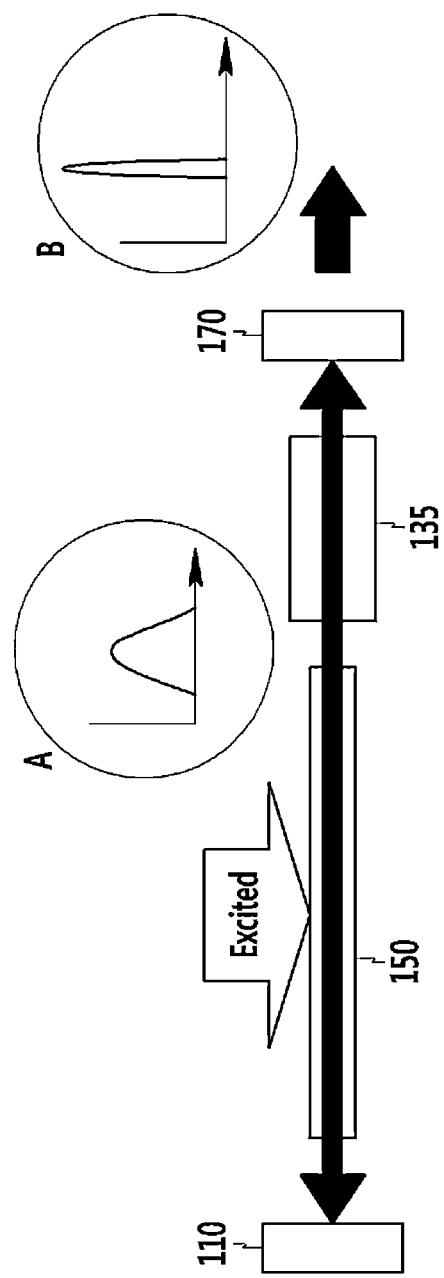
Figure 5:
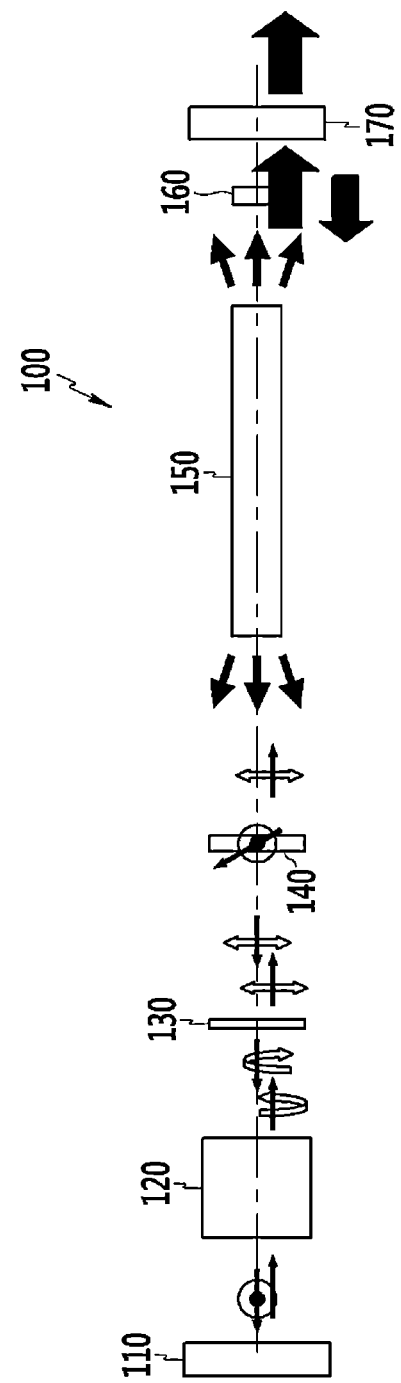

A method of generating the exposure beam in the oscillator 100 is schematically shown in FIG. 4, and FIG. 5 shows a total polarization direction in the oscillator 100 according to an exemplary embodiment of the present invention.

As illustrated in FIG. 4, in the oscillator 100, the oscillator pumping chamber 150 is disposed between the rear mirror 110 to excite the total reflection and the front mirror 170 to transmit a portion of the light and reflecting the rest such that a pulse having a frequency of several hundred microseconds (μsec) is formed. A flash lamp such as a Nd:YAG rod may be housed in the oscillator pumping chamber 150 according to the present exemplary embodiment.

The Q switch 135 is additionally implemented to reduce the width of the excited pulse and then to convert the oscillating pulse into a pulse having a high energy peak. That is, a pulse having a wide width as shown in graph A of FIG. 4 is converted into a pulse having a narrow width and high energy as shown in graph B by using the Q switch 135. The high energy pulse is thus emitted through the front mirror 170.

Hereinafter, the operation and the polarization direction in the oscillator 100 according to the exemplary embodiment will be described with reference to FIG. 5 based on the operation of the basic oscillator 100.

The excited light may be emitted to the surrounding area by the oscillator pumping chamber 150. In an exemplary embodiment of the present invention, when using a Nd:YAG rod, light of a 1064 nm wavelength is naturally excited and emitted. The light emitted to the surrounding area is directly incident into the first polarizer 140 or into the second polarizer 160. While the light incident to the second polarizer 160 may be polarized and partially emitted after being incident to the front mirror 170, most of the light is reflected, is re-incident to the second polarizer 160, and is then incident to the first polarizer 140. The light thus emitted from the oscillator pumping chamber 150 is incident into the first polarizer 140 and is linear-polarized according to the polarization direction of the first polarizer 140 (in the exemplary embodiment of FIG. 5, the linear polarization of the vertical direction ($\updownarrow$) is transmitted, and the linear polarization of the direction ($\odot$) perpendicular thereto is blocked. Hereafter the linear polarization of the vertical direction ($\updownarrow$) is referred to as "a P wave," and the linear polarization of the direction ($\odot$) perpendicular thereto is referred to as "an S wave"). Next, the light is incident into the wave plate 130 and the λ/4 polarization is provided such that the P wave is converted to have circular polarization. Next, in the pocket cell 120, the circular polarization is converted into the S wave. The S wave is reflected by the rear mirror 110 such that the phase changes by 180 degrees but the S wave is maintained, and is again incident into the pocket cell 120 such that the light is changed into the circular polarization and is again incident into the wave plate 130 to be changed into the P wave. Next, after the light is transmitted through the first polarizer 140, the light is amplified in the oscillator pumping chamber 150, and then passes through the second polarizer 160, and thereby the pulse of the high energy is emitted into the front mirror 170. The front mirror 170 partially reflects the light such that the laser beam is emitted while forming the resonance with the rest through the above-mentioned path.

Referring back to FIG. 2, the oscillated exposure beam (also referred to as the laser beam) generated in the oscillator 100 is incident into the exposure beam scattering unit 200. The exposure beam scattering unit 200 may include a convex lens 220 and a concave lens 210, and may serve to enlarge an aperture by the exposure beam by using the lenses 210 and 220 (the aperture may vary in certain embodiments, however, for example, the exposure beam of 5 mm is may be enlarged to an exposure beam of 9 mm).

The exposure beam passing through the exposure beam scattering unit 200 is incident to the amplifier 300. The amplifier 300 may include a pre-amp pumping chamber 310, a rotator 320, and a post-amp pumping chamber 330. The laser (having a frequency of 5-6 nsec) generated from the amplifier 300 and having a small pulse of 1064 nm may be amplified by about 10 times by the inductive emission effect through the two pumping chambers 310 and 330. The rotator 320 serves to control the location of the center of the exposure beam.

The light path of the amplified exposure beam is changed by the first bend mirror 410 and the second bend mirror 420, and is incident to the high-frequency generator 500.

The high-frequency generator 500 may include a first generator 510 and a second generator 520. The first generator 510 changes the light to high frequency through a second harmonized generator (SHG), and the second generator 520 changes the light to high frequency (or a short wavelength) through a third harmonized generator (THG). The operation of the high-frequency generator 500 will be described with reference to FIG. 6 and FIG. 7.

Meanwhile, non-linear optical crystal has birefringence. Such property may be used to generate a high frequency under a special condition by utilizing the fact that the speed of light (refractive index) varies along the axis in the crystal. In an exemplary embodiment of the present invention, exposure beams with a wavelength of 532 nm and a wavelength of 355 nm may be generated from a wavelength of 1064 nm by using two kinds of non-linear optical crystals.

Figure 6:
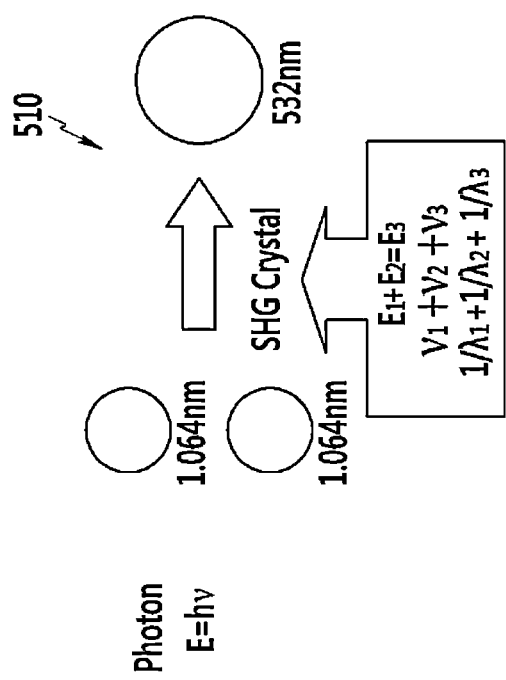

The operation of the first generator 510 is shown in FIG. 6. The first generator 510 generates a high frequency having a twice-higher frequency (i.e., a wavelength of ½) with the SHG crystal. That is, as shown in FIG. 6, two incident photons of 1064 nm are combined to generate a photon having the half wavelength of 532 nm by using the SHG crystal.

Figure 7:
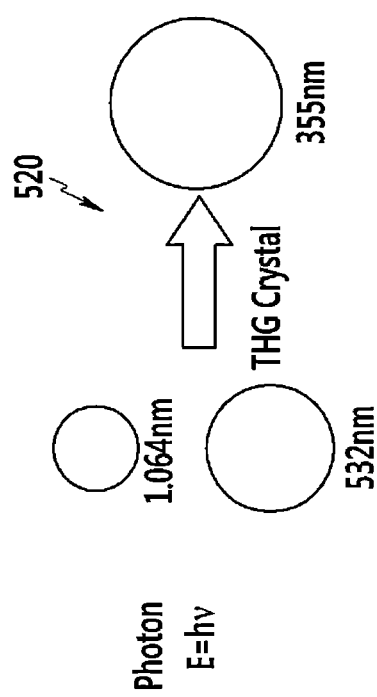

FIG. 7 shows the operation of the second generator 520. The second generator 520 generates a high frequency having a three times higher frequency (i.e., ⅓ the wavelength) by using the THG crystal. That is, as shown in FIG. 7, the incident photons of 1064 nm and 532 nm are combined to generate a photon having a wavelength of 355 nm by using the THG crystal.

By the operation of the first and second generators 510 and 520 shown in FIG. 6 and FIG. 7, the exposure beam having the wavelength of 1064 nm may additionally include the exposure beam having the wavelength of 532 nm and 355 nm, and the resultant exposure beam may contain three wavelengths, 1064 nm, 532 nm, and 355 nm.

The exposure beam passed through the high-frequency generator 500 is incident to the wavelength division unit 600. The wavelength division unit 600 may include a first prism 610 and a second prism 620, and may further include a first dumper 630 to remove the light reflected from the first prism 610 to the outside. The first dumper 630 receives and cancels the incident light so that it is not emitted to the outside.

Figure 8:
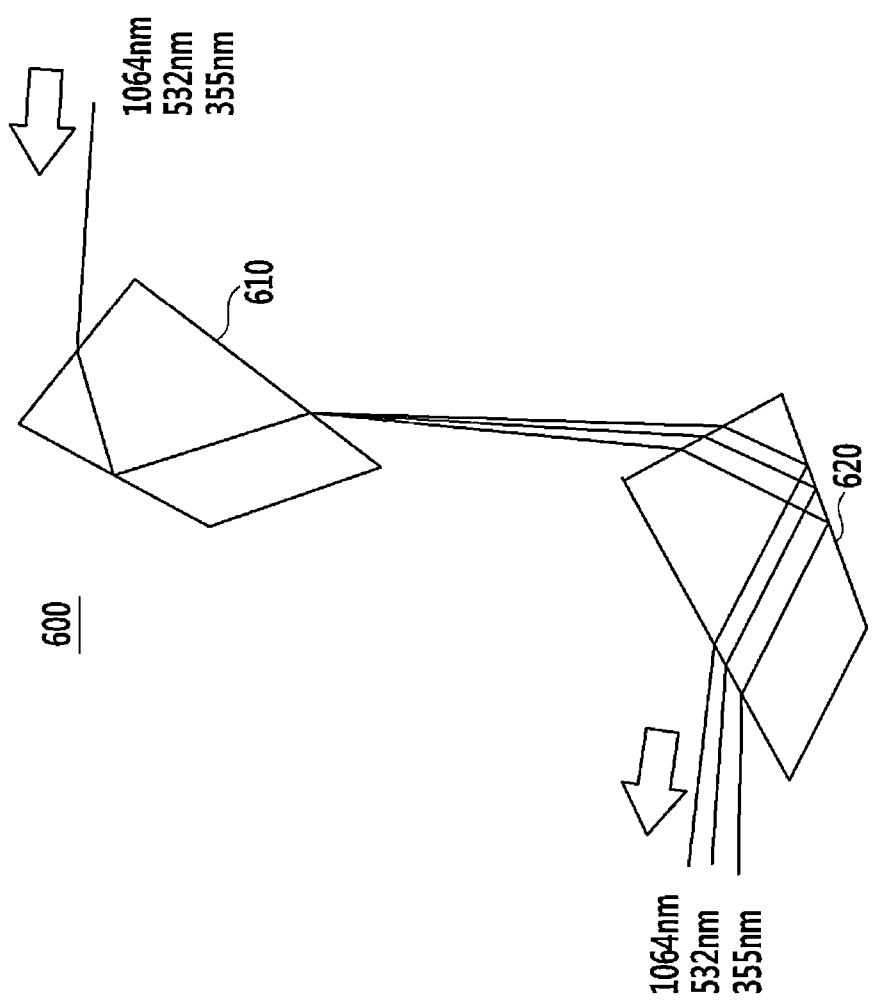

As shown in FIG. 8, the first prism 610 and the second prism 620 of the wavelength division unit 600 may have different paths according to wavelengths due to the differences of refractive indices of the wavelengths.

The exposure beams thus divided according to wavelengths are respectively incident to the first to third sampling mirrors 710, 720, and 730. The exposure beam of 1064 nm is incident to the first sampling mirror 710, and the first sampling mirror 710 divides the exposure beam of 1064 nm to be incident to the portion of the first power monitor 715 and the rest to be incident to a second dumper 740. The first power monitor 715 monitors the wavelength and the light amount of the exposure beam of 1064 nm to see whether the exposure beam is properly oscillated in the oscillator 100. The exposure beam of 532 nm is incident to the second sampling mirror 720, and the second sampling mirror 720 divides the exposure beam of 532 nm into the portion directed to the second power monitor 725 and the rest directed to the second dumper 740. The second power monitor 725 monitors the wavelength and the light amount of the exposure beam of 532 nm to see whether the exposure beam of the half wavelength is properly generated in the first oscillator 510. The exposure beam of 355 nm is incident to the third sampling mirror 730, and the third sampling mirror 730 divides the exposure beam of 355 nm into the portion directed to the third power monitor 735 and the rest directed to the output shutter unit 800. The third power monitor 735 monitors the wavelength and the light amount of the exposure beam of 355 nm to see whether the exposure beam of the ⅓ wavelength is properly generated in the second generator 520.

The output shutter unit 800 may include an output shutter 810, and outputs the exposure beam of the wavelength of 355 nm transmitted from the third sampling mirror 730 through the output shutter 810.

Figure 9:
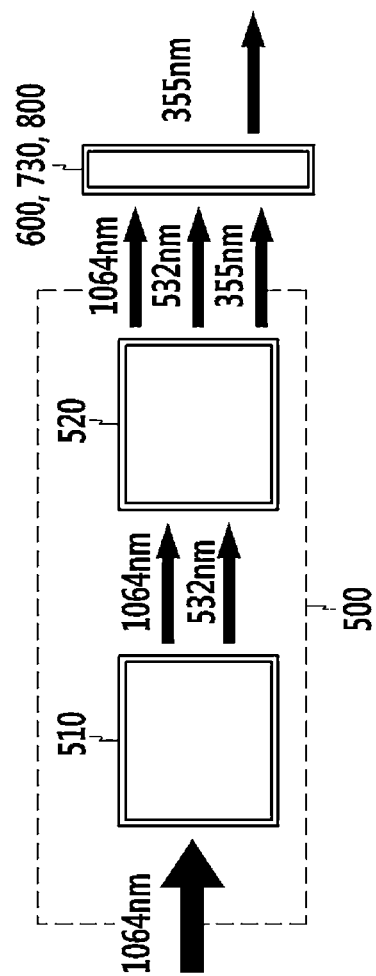

FIG. 9 schematically illustrates the operation performed between the high-frequency generator 500 and the output shutter unit 800. As shown in FIG. 9, the 532 nm wavelength is generated by the first generator 510 of the high-frequency generator 500, the 355 nm wavelength is generated by the second generator 520, and only the 355 nm exposure beam is outputted through the wavelength division unit 600, the third sampling mirror 730, and the output shutter unit 800.

However, after a long time of usage of the light exposure apparatus 1, the intensity of the exposure beam may be diminished, which will be described with reference to FIG. 10 to FIG. 13.

FIG. 10 to FIG. 13 are diagrams of a shape of an exposure beam when intensity of an exposure beam is reduced and analyses of the shape thereof.

Figure 10:
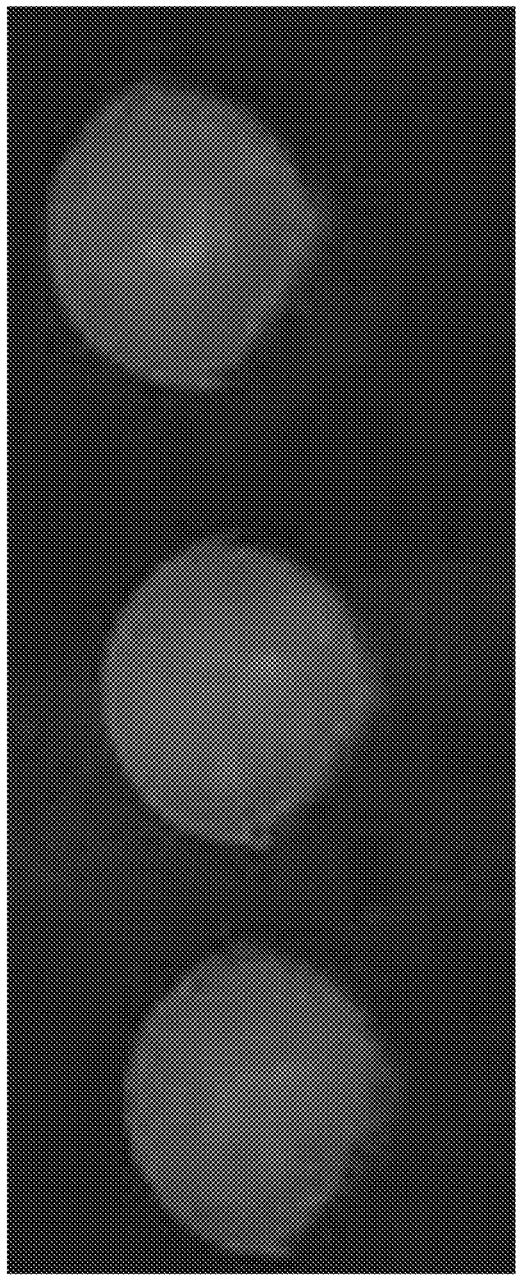
FIG. 10 to FIG. 13 are diagrams of a shape of an exposure beam when intensity of an exposure beam is reduced and analyses of the shape thereof.

FIG. 10 is a diagram to show an exposure beam emitted from an aged light exposure apparatus 1.

Figure 11:
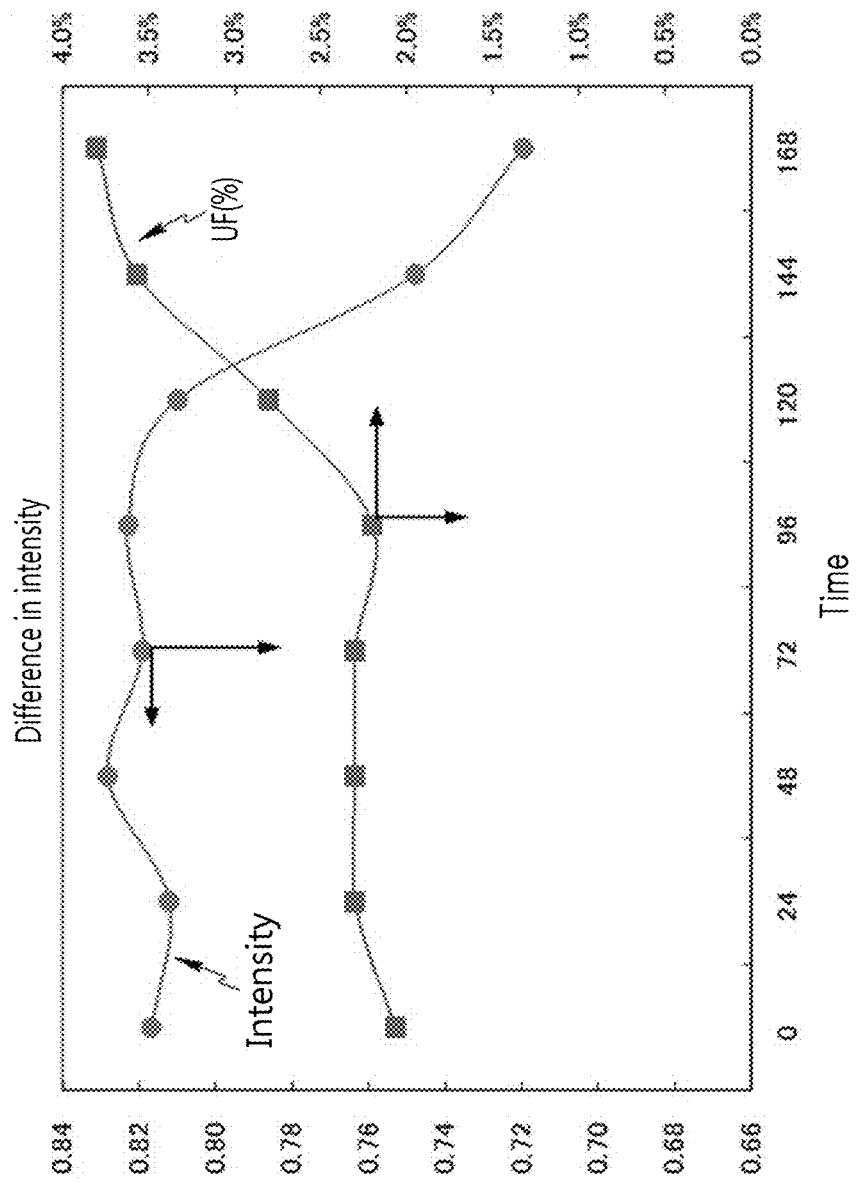

As shown in FIG. 10, in the aged light exposure apparatus 1, the exposure beam does not have the circular shape and a partially distorted cross-section is generated. The deterioration of the intensity may be caused by the distorted exposure beam. FIG. 11 shows that, as the usage of the light exposure apparatus passes 120 hours, the intensity of the exposure beam emitted from the light exposure apparatus 1 is rapidly reduced by about 15%. In FIG. 11, UF, indicating uniformity by percent, is calculated by Equation 1 given below.

(maximum intensity of exposure beam−minimum intensity of exposure beam)/(maximum intensity of exposure beam+minimum intensity of exposure beam) [Equation 1]

Figure 12:
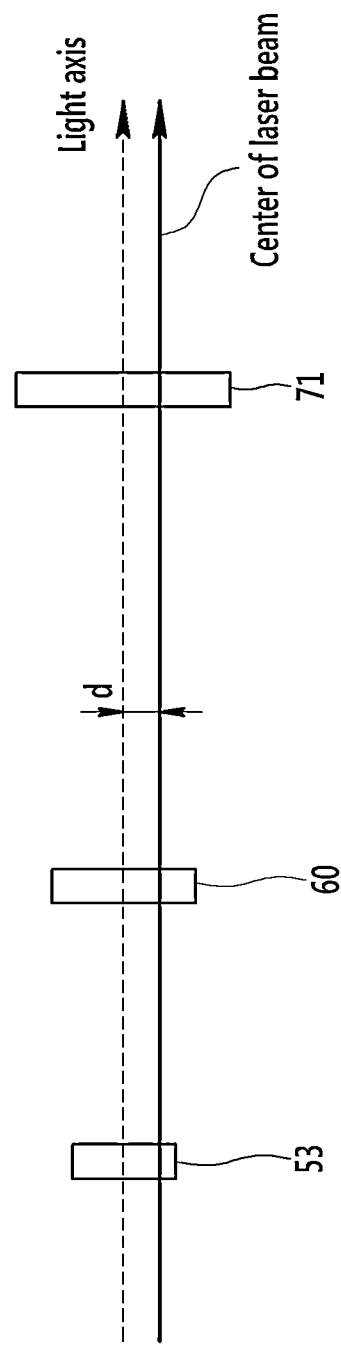

The reduction of intensity of the exposure beam mentioned above is caused because the axis of the optical lens (the first fly eye lens 53, the plane parallel rotation plate 60, the first light collecting lens 71, etc.) and the center of the laser beam are misaligned by "d" which is caused by the misalignment of the path of the exposure beam as shown in FIG. 12.

Figure 13:
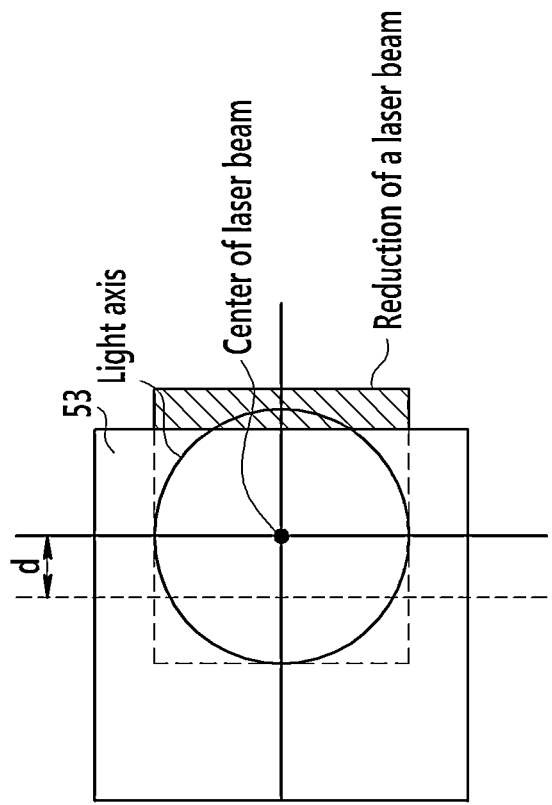

FIG. 13 shows a relationship of an exposure beam and the center of the first fly eye lens 53.

As shown in FIG. 13, the laser beam of the aged light exposure apparatus 1 may be misaligned from the center of the first fly eye lens 53 by d. As a result, a part at the right side of the laser beam may be misaligned from the first fly eye lens 53, and as a result, as shown in FIG. 10, the exposure beam may be emitted with a distorted cross-section to trigger the problematic reduction of light intensity.

Therefore, in an exemplary embodiment, the axis of the first fly eye lens 53 and the center of the laser beam may be continuously monitored to see they are in alignment. Exemplary embodiments of FIG. 14 to FIG. 16 are relevant to such purpose of the present invention.

Figure 14:
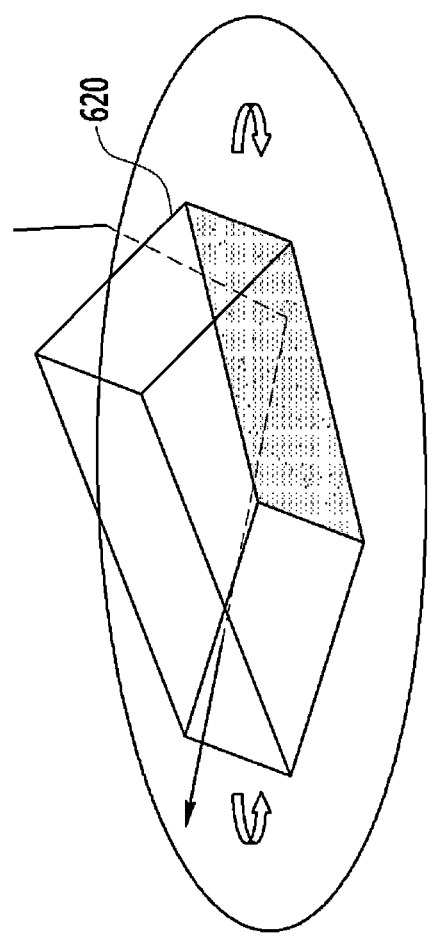
FIG. 14 to FIG. 16 are diagrams to illustrate a method of enhancing intensity of an exposure beam according to an exemplary embodiment of the present invention.
Figure 15:
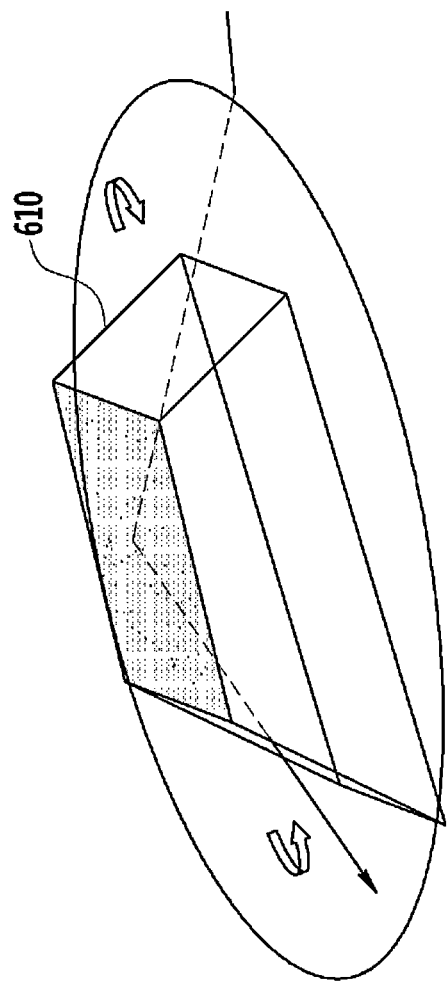
Figure 16:
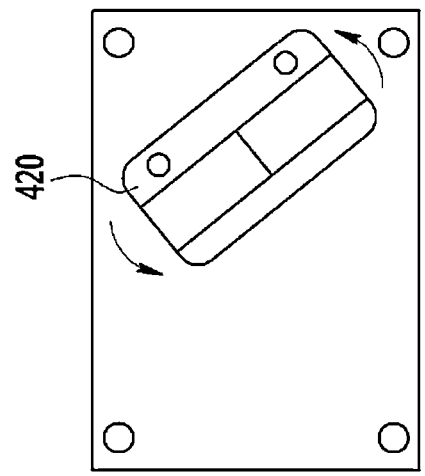

FIG. 14 to FIG. 16 are diagrams showing a method for enhancing intensity of an exposure beam according to an exemplary embodiment of the present invention by using internal components of the exposure beam generator 10.

FIG. 14 illustrates an exemplary embodiment in which the second prism 620 of the wavelength division unit 600 is rotated to align the center of the laser beam with the light axis, and FIG. 15 illustrates an exemplary embodiment in which the first prism 610 of the wavelength division unit 600 is rotated to align the center of the laser beam with the light axis.

Further, FIG. 16 illustrates an exemplary embodiment in which the second bend mirror 420 is rotated to align the center of the laser beam with the light axis. Although not shown, in another exemplary embodiment, the first bend mirror 410 may be rotated. However, rather than the first bend mirror 410, the second bend mirror 420 has a direct influence on a change of center of the exposure beam (laser beam) which is outputted, and FIG. 16 representatively shows the second bend mirror 420.

As illustrated above with reference to FIG. 14 to FIG. 16, in the light exposure apparatus 1 according to an exemplary embodiment of the present invention, if the light intensity of the exposure beam is reduced, only the components (the second prism 620, the first prism 610, the second bend mirror 420, etc.) in the exposure beam generator 10 are adjusted, but the components of the light exposure apparatus 1 disposed outside the exposure beam generator 10 are not adjusted. If only the components inside the exposure beam generator 10 are adjusted, the other components of the light exposure apparatus 1 are set in advance and the fixed state is maintained which advantageously makes separate setting adjustments unnecessary. As a result, the time required to adjust other components of the light exposure apparatus 1 may be reduced, and the exposure may be continuously performed while maintaining the fixed state. Also, a deviation d of the center of the laser beam generated in the aged light exposure apparatus 1 is not so large to necessitate change of other components of the light exposure apparatus. Therefore, the intensity of the exposure beam can be maintained by simply controlling the second prism 620, the first prism 610, and the second bend mirror 420 in the exposure beam generator 10.

Table 1 below shows adjustment amounts to correct the center (axis) of a laser beam according to an adjustment angle of the second prism 620, the first prism 610, and the second bend mirror 420.

TABLE 1

| deviation amount (mm) of Laser beam center | Adjustment angle (mrad) of Second prism 620 | Adjustment angle (mrad) of First prism 610 | Adjustment angle (mrad) of Second bend mirror 420 |
| --- | --- | --- | --- |
| 0.1 | 0.072 | 0.077 | 0.057 |
| 0.2 | 0.143 | 0.154 | 0.114 |
| 0.3 | 0.215 | 0.231 | 0.170 |
| 0.4 | 0.278 | 0.308 | 0.227 |
| 0.5 | 0.358 | 0.385 | 0.284 |
| 0.6 | 0.430 | 0.462 | 0.341 |
| 0.7 | 0.502 | 0.538 | 0.398 |
| 0.8 | 0.573 | 0.615 | 0.455 |
| 0.9 | 0.645 | 0.692 | 0.511 |
| 1.0 | 0.717 | 0.769 | 0.568 |
| 1.1 | 0.789 | 0.846 | 0.625 |
| 1.2 | 0.860 | 0.923 | 0.682 |
| 1.3 | 0.932 | 1.000 | 0.739 |
| 1.4 | 1.004 | 1.077 | 0.795 |
| 1.5 | 1.075 | 1.154 | 0.852 |
| 1.6 | 1.147 | 1.231 | 0.909 |
| 1.7 | 1.219 | 1.308 | 0.966 |
| 1.8 | 1.290 | 1.385 | 1.023 |
| 1.9 | 1.362 | 1.462 | 1.080 |
| 2.0 | 1.434 | 1.538 | 1.136 |

Here, the adjustment angle is an angle that is adjusted in a clockwise direction, and the deviation of the center of the laser beam is indicated by "d" in FIG. 12 and FIG. 13. That is, according to Table 1, upon determination that the center of the laser beam is spaced apart from the axis by the distance d, one of the second prism 620, the first prism 610, and the second bend mirror 420 may be adjusted in the clockwise direction according to Table 1.

The content of Table 1 may be stored in a memory of a controller of the light exposure apparatus (not shown). The distance d of the center of the laser beam from the light axis is measured, and then an appropriate angle is adjusted to prevent the reduction of light intensity of the exposure beam.

Figure 17:
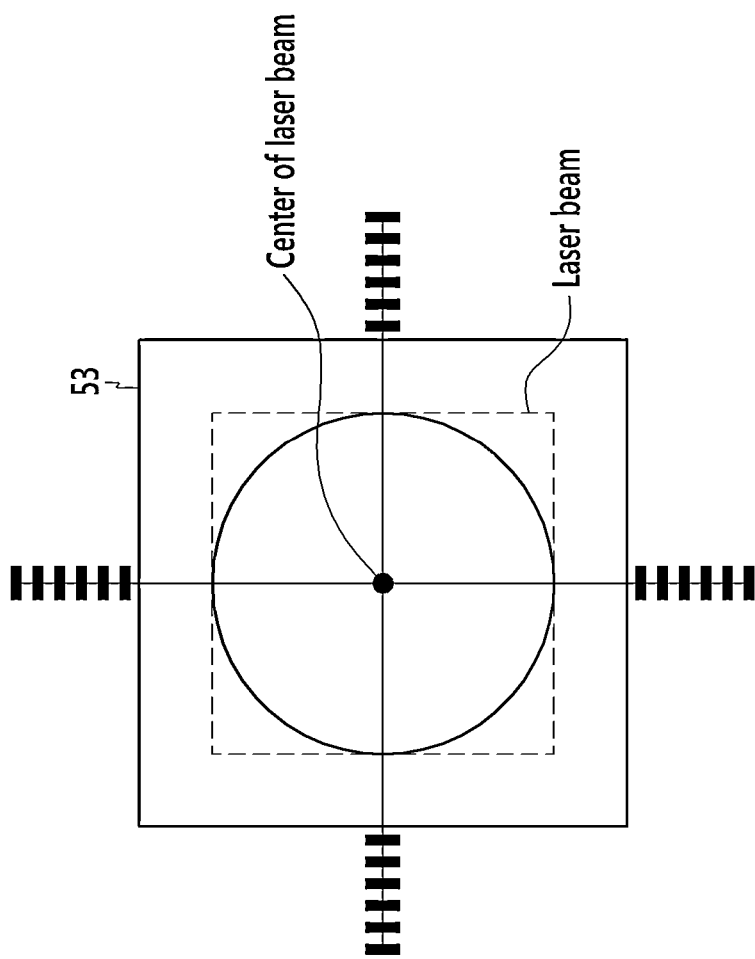
FIG. 17 to FIG. 19 are diagrams to illustrate a state of an exposure beam that is controlled so as not to reduce intensity according to an exemplary embodiment of the present invention, a diagram of the shape, and a graph of the shape according to time.
Figure 18:
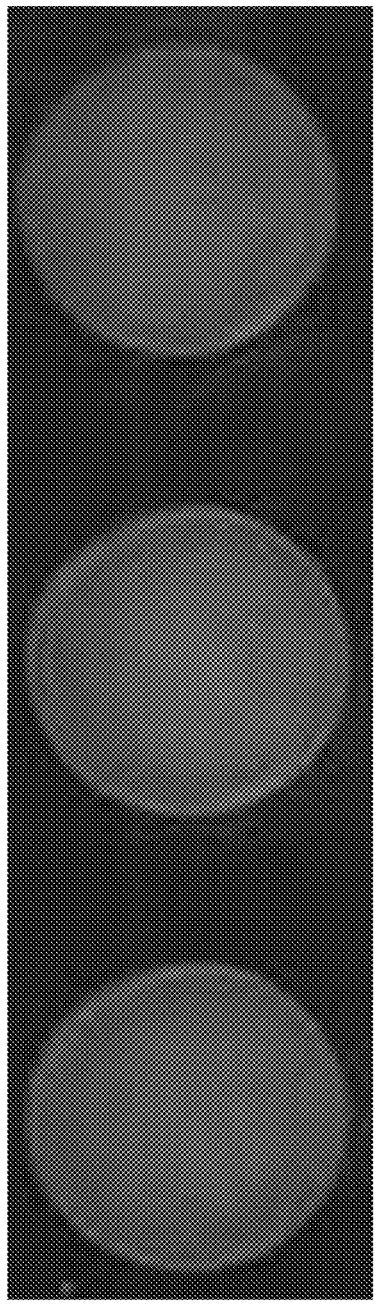
Figure 19:
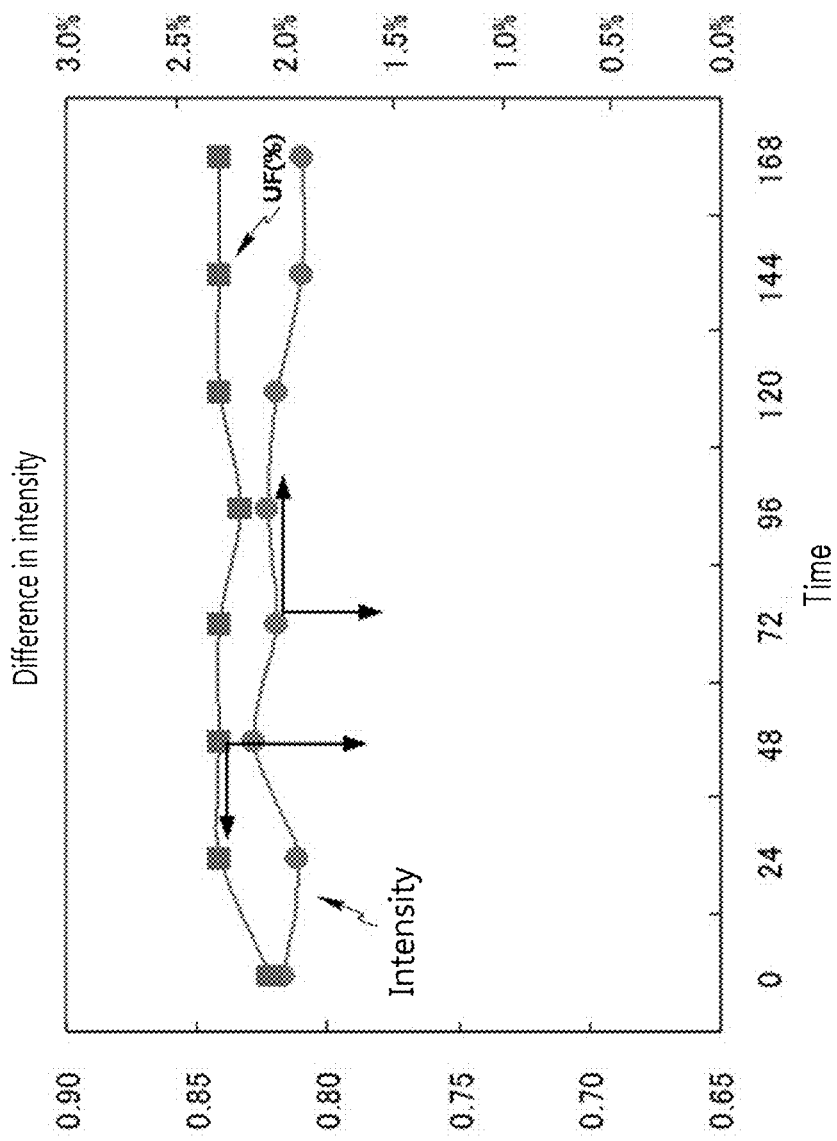

FIG. 17 to FIG. 19 are a diagram to show a state of an exposure beam that has been adjusted so that the intensity of the exposure beam is not reduced according to an exemplary embodiment of the present invention, a photograph showing the resultant exposure beam, and a graph of the shape with respect to time.

As shown in FIG. 17, the axis of the first fly eye lens 53 is aligned with the center of the laser beam by manipulating the internal components of the exposure beam generator 10. FIG. 18 illustrates that the exposure beam emitted from the light exposure apparatus 1 is circular. Also, FIG. 19 illustrates that a loss of light does not occur as time passes such that the light intensity is not reduced.

The above description has been made with respect to the axis of the first fly eye lens 53 and the center of the laser beam. But the embodiments are not limited to the specific implementations thereof, and embodiments may be directed to other optical lenses.

Hereinafter, a method for controlling a light exposure apparatus according to an exemplary embodiment of the present invention will be described with reference to FIG. 20.

Figure 20:
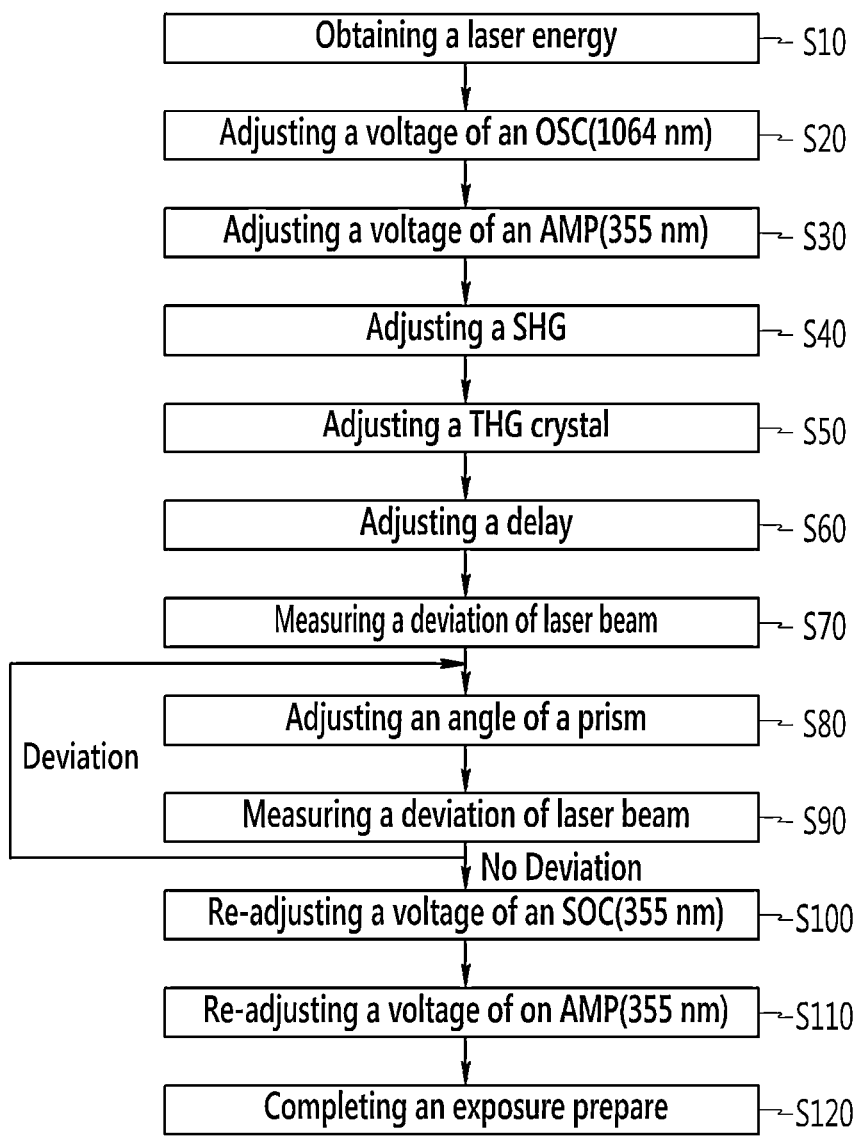
FIG. 20 is a diagram to illustrate a method for controlling a light exposure apparatus according to an exemplary embodiment of the present invention.

FIG. 20 is a diagram to illustrate a method for controlling a light exposure apparatus according to an exemplary embodiment of the present invention.

As shown in FIG. 20, in step S10, a signal that instructs oscillation is received from an external device, a laser power source is turned on, and an oscillator 100 of a light exposure apparatus 1 is applied with energy.

Thereafter, the voltage of an oscillator (OSC) pumping chamber of an oscillator 100 is adjusted to generate a laser with a wavelength of 1064 nm (S20). In this step, the voltage may be adjusted to properly generate the laser of 1064 nm while monitoring the laser by using a monitor unit (not shown) for the 1064 nm wavelength formed inside the oscillator 100.

Thereafter, the voltages of the pre-amp pumping chamber 310 and the post-amp pumping chamber 330 of the amplifier 300 are adjusted. The voltage of the amp pumping chambers 310 and 330 may be adjusted to properly generate the laser of 355 nm while monitoring the laser through a monitor unit (not shown) for a 355 nm wavelength disposed in the amplifier 300 (S30).

Thereafter, the angle of an SHG crystal is adjusted in the first generator 510 of the high-frequency generator 500 to properly generate a laser with a wavelength of 532 nm (S40).

Also, the angle of a THG crystal is adjusted in the second generator 520 of the high-frequency generator 500 to properly generate the laser with the wavelength of 355 nm (S50).

Thereafter, timing of emission of the laser beam is controlled by adjusting a delay value that is set up in the light exposure apparatus 1 to emit an optimized laser beam (S60). In alternative exemplary embodiments, the step of adjusting the delay value is not included, and the step of adjusting the delay value may be accomplished in a different manner from the one shown in FIG. 20.

Thereafter, a deviation of the laser beam is measured. The deviation of the laser beam may be measured by using the distance between the axis of the first fly eye lens 53 and the center of the laser beam, and may also be measured by monitoring whether the laser beam has a partially distorted cross-section through a measurement of the diameter of the laser beam (S70). In an exemplary embodiment, a determination unit may be provided which is configured to determine whether a misalignment of the center of the laser beam from the axis of the first fly eye lens 53 has occurred. The determination unit may compare the measured deviation with a certain deviation threshold, and determines that the center of the laser beam is misaligned with the axis of the first fly eye lens 53 when the measured deviation exceeds the certain deviation threshold. In a case as shown in FIG. 20, the laser beam may be observed at a backend of the first fly eye lens 53.

Thereafter, the angle of the prism is adjusted based on the degree of the deviation (S80). Here, the prism is the second prism 620 or the first prism 610. In some exemplary embodiments, the angle of the second bend mirror 420 may be adjusted or several among them may be adjusted together (S80).

Thereafter, the deviation of the laser beam is again measured. When it is determined that the laser beam is still deviated based on the re-measurement, the step S80 of adjusting the angle of the prism is performed again (S90).

If no deviation is detected as a result of re-measuring (S90) the deviation of the laser beam, the voltage of the oscillator (OSC) pumping chamber of the oscillator 100 is readjusted (S100), and the voltages of the pre-amp pumping chamber 310 and the post-amp pumping chamber 330 of the amplifier 300 are also readjusted (S110). In the step of adjusting the voltage of the oscillator (OSC) pumping chamber (S100) and the step of readjusting the voltage of the pre-amp pumping chamber 310 and the post-amp pumping chamber 330 of the amplifier 300 (S110), the voltage may be adjusted based on whether the laser generated with the 355 nm wavelength by using the third power monitor has an appropriate wavelength. These readjusting steps S100 and S110 are performed to obtain an accurate wavelength of the output laser, and thus the steps may be omitted. Also, in some embodiments, only one of the two readjusting steps S100 and S110 may be executed.

When the above steps are finished, preparation for exposure for a photolithography process is completed (S120).

A method for controlling a light exposure apparatus according to another exemplary embodiment of the present invention will be described with reference to a signal waveform diagram shown in FIG. 21.

Figure 21:
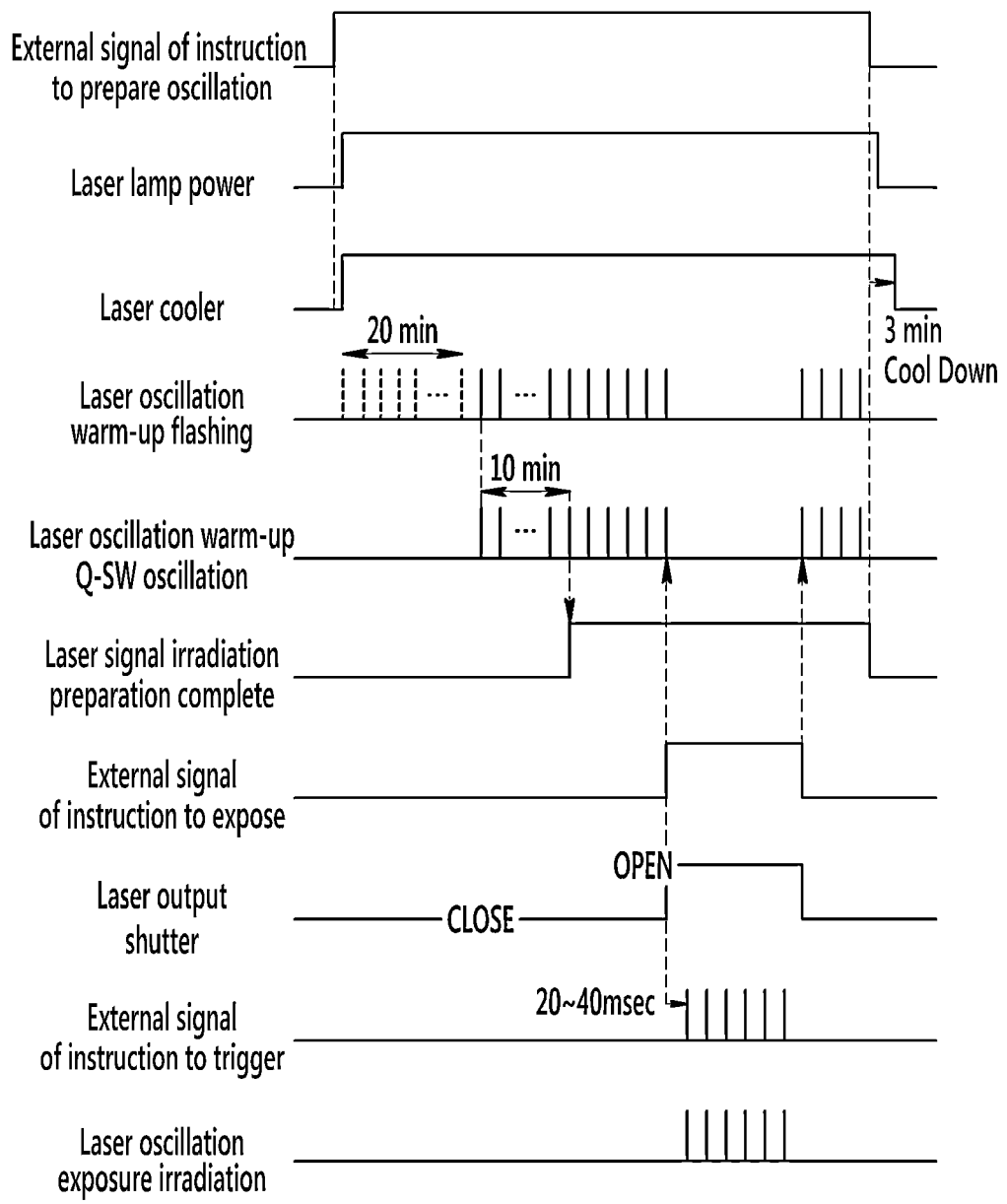
FIG. 21 is a diagram of a signal waveform diagram of a control signal according to an exemplary embodiment of the present invention.

FIG. 21 is a diagram of a signal waveform diagram of a control signal according to an exemplary embodiment of the present invention.

First, an instruction to prepare oscillation of the light exposure apparatus 1 is provided from outside. That is, a high voltage as a signal of an instruction to prepare oscillation is applied.

After the instruction to prepare oscillation of the light exposure apparatus 1 is thus applied, a power is applied to the laser lamp in the oscillator 100 of the light exposure apparatus 1. That is, the high voltage as the power signal of the laser lamp is applied.

Thereafter, a cooler (not shown) in the light exposure apparatus 1 is operated to maintain the light exposure apparatus 1 at a certain temperature range.

Thereafter, a warm-up process is performed to oscillate the laser for about 20 minutes. Thereafter, the Q switch 135 of the oscillator 100 is warmed up for about 10 minutes. The above two warm-up processes are performed as a warm-up procedure of the laser.

If the preparation to operate the exposure beam generator 10 is done through the above-mentioned processes, the exposure beam generator 10 triggers an enable signal to a high level notifying that the exposure beam generator 10 is capable of operation, and a rising edge of the signal is transferred to an external device, thereby serving to notify the completion of the preparation of operating the exposure beam generator 10.

If the signal indicating the instruction of exposure is applied with the high level from the external device, the output shutter 810 of the exposure beam generator 10 is also opened to output the laser beam.

Thereafter, a laser oscillation exposure is performed according to the exposure signal applied from outside.

FIG. 21 is a diagram to show an external device and a transmitted and received signal waveform of a preparation process to emit a laser beam and an emission process of a laser, which is different from FIG. 20.

If a deviation exceeding a certain degree is recognized while the laser beam is exposed based on the signal, as in FIG. 21, and the path of the laser beam is measured every certain time under the exposure and the deviation of the center is measured, the center axis of the laser beam is adjusted according to an exemplary embodiment of the present invention.

FIG. 22 is a diagram to illustrate an exposure method according to a scanning scheme according to an exemplary embodiment of the present invention.

FIG. 22 illustrates a process of exposing a mother substrate 2000 by using a small mask 1000 corresponding to a portion of the mother substrate 2000 (mother glass; referred to as "Glass" in FIG. 22). While a small mask 1000 is used in the exemplary embodiment, an entire area of a larger sized substrate may be exposed through relative movements of the substrate 2000 and the mask 1000 in the exposure process.

Here, the exposure is performed while the small mask is aligned with respect to an alignment key or a black matrix formed on the mother substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of controlling a light exposure apparatus comprising an exposure beam generator comprising a prism or a bend mirror, an oscillator comprising an oscillator pumping chamber, an amplifier comprising an amp pumping chamber, a high-frequency generator, and a vacuum chamber through which light generated in the exposure beam generator passes, the method comprising:
generating an exposure beam comprising:
adjusting a voltage of the oscillator pumping chamber;
adjusting a voltage of the amp pumping chamber; and
changing a wavelength in the high-frequency generator;
measuring a deviation of a center of the exposure beam from a reference line in the vacuum chamber; and
adjusting the prism or the bend mirror in the exposure beam generator to adjust the center of the exposure beam when the center of the exposure beam is misaligned with the reference line.

2. The method of claim 1, wherein
the high-frequency generator further comprises:
a first generator comprising a second harmonized generator (SHG) crystal; and
a second generator comprising a third harmonized generator (THG) crystal,
wherein the changing of the wavelength in the high-frequency generator comprises:
adjusting an SHG determining angle to generate a wavelength of 532 nm; and
adjusting a THG determining angle to generate a wavelength of 355 nm.

3. The method of claim 1, further comprising:
readjusting the voltage of the oscillator pumping chamber of the oscillator and readjusting the voltage of the amp pumping chamber of the amplifier before the adjusting of the center of the exposure beam.

4. The method of claim 1, further comprising:
emitting the exposure beam through the amplifier, the bend mirror, the high-frequency generator, and the prism.

5. The method of claim 4, wherein the bend mirror bends a path of the exposure beam passing through the amplifier.

6. The method of claim 5, wherein the bend mirror comprises a first bend mirror and a second bend mirror, the method further comprising:
adjusting the second bend mirror to change the path of the exposure beam.

7. The method of claim 4, wherein the prism comprises a first prism and a second prism, the method further comprising:
adjusting the first or the second prism to change the path of the exposure beam.

8. The method of claim 4, wherein the exposure beam generator further comprises a sampling mirror and a power monitor, the method further comprising:

dividing the exposure beam having passed through the prism into a plurality of beam portions based on wavelength, and partially reflecting and transmitting a beam portion having a selected wavelength in the sampling mirror such that the beam portion having the selected wavelength is incident to the power monitor.

9. The method of claim 8, wherein the exposure beam generator further comprises an output shutter unit, the method further comprising:

emitting the partially transmitted beam portion outside through the output shutter unit.

10. The method of claim 1, further comprising:

comparing the measured deviation with a first deviation threshold; and determining that the center of the exposure beam is misaligned with the reference line when the measured deviation is greater than the first deviation threshold.

11. The method of claim 10, wherein the reference line comprises a center of a fly eye lens in the vacuum chamber, and the measuring of the deviation of the center of the exposure beam from the reference line comprises measuring a distance of the center of the exposure beam from the center of the fly eye lens.

12. A light exposure apparatus, comprising:

an exposure beam generator comprising:
  a prism or a bend mirror;
  an oscillator comprising an oscillator pumping chamber;
  an amplifier comprising an amp pumping chamber;
  a high-frequency generator; and
  a vacuum chamber, the vacuum chamber being configured to pass an exposure beam generated by the exposure beam generator;

a measurement unit to measure a deviation of a center of the exposure beam from a reference line in the vacuum chamber; and an adjustment unit to adjust the prism or the bend mirror in the exposure beam generator to adjust the center of the exposure beam when the center of the exposure beam is misaligned with the reference line, wherein the exposure beam generator is configured to generate the exposure beam by adjusting a voltage of the oscillator pumping chamber, adjusting a voltage of the amp pumping chamber, and changing a wavelength in the high-frequency generator.

13. The apparatus of claim 12, further comprising:

a comparison unit to compare the measured deviation with a first deviation threshold; and a determination unit to determine that the center of the exposure beam is misaligned with the reference line when the measured deviation is greater than the first deviation threshold.

14. The apparatus of claim 13, wherein the high-frequency generator further comprises;

a first generator comprising a second harmonized generator (SHG) crystal; and a second generator comprising a third harmonized generator (THG) crystal, wherein the wavelength in the high-frequency generator is configured to be changed by adjusting an SHG determining angle to generate a wavelength of 532 nm, and by adjusting a THG determining angle to generate a wavelength of 355 nm.

15. The apparatus of claim 13, wherein the reference line comprises a center of a fly eye lens in the vacuum chamber, and the measuring of the deviation of the center of the exposure beam from the reference line comprises measuring a distance of the center of the exposure beam from the center of the fly eye lens.

16. The apparatus of claim 15, further comprising:

a light collecting lens to collect the exposure beam at an end of the vacuum chamber.

17. The apparatus of claim 13, wherein the exposure beam generator is configured to emit the exposure beam generated by the oscillator through the amplifier, the bend mirror, the high-frequency generator, and the prism.

18. The apparatus of claim 17, wherein the bend mirror is configured to bend a path of the exposure beam passing through the amplifier; and the bend mirror comprises a first bend mirror and a second bend mirror.

* * * * *